(12) United States Patent
Sengoku et al.

(10) Patent No.: US 11,088,303 B2
(45) Date of Patent: Aug. 10, 2021

(54) LIGHT EMITTING DEVICE

(71) Applicant: TOYODA GOSEI CO., LTD., Kiyosu (JP)

(72) Inventors: Akira Sengoku, Kiyosu (JP); Shun Ito, Kiyosu (JP)

(73) Assignee: TOYODA GOSEI CO., LTD., Kiyosu (JP)

( * ) Notice: Subject to any disclaimer, the term of this patent is extended or adjusted under 35 U.S.C. 154(b) by 0 days.

(21) Appl. No.: 16/534,583

(22) Filed: Aug. 7, 2019

(65) Prior Publication Data

US 2020/0105985 A1 Apr. 2, 2020

(30) Foreign Application Priority Data

Sep. 28, 2018 (JP) .............................. JP2018-184318

(51) Int. Cl.
*H01L 33/54* (2010.01)
*H01L 33/38* (2010.01)
*H01L 33/62* (2010.01)
*H01L 25/075* (2006.01)
*H01L 25/16* (2006.01)
*H01L 33/50* (2010.01)

(52) U.S. Cl.
CPC .......... *H01L 33/54* (2013.01); *H01L 25/0753* (2013.01); *H01L 33/38* (2013.01); *H01L 33/62* (2013.01); *H01L 25/167* (2013.01); *H01L 33/505* (2013.01); *H01L 2933/005* (2013.01)

(58) Field of Classification Search
CPC combination set(s) only.
See application file for complete search history.

(56) References Cited

U.S. PATENT DOCUMENTS

| | | | | |
|---|---|---|---|---|
| 2009/0101929 A1* | 4/2009 | Mo | ...................... | H01L 33/0093 257/98 |
| 2011/0297994 A1* | 12/2011 | Sugizaki | ............. | H01L 25/0753 257/99 |
| 2011/0303894 A1* | 12/2011 | Watanabe | ........... | H01L 33/0075 257/13 |
| 2016/0035952 A1* | 2/2016 | Yamada | .................. | H01L 33/50 257/98 |
| 2018/0033926 A1 | 2/2018 | Nonogawa | | |

FOREIGN PATENT DOCUMENTS

JP 2018-019032 A 2/2018

* cited by examiner

*Primary Examiner* — Moazzam Hossain
(74) *Attorney, Agent, or Firm* — McGinn I.P. Law Group, PLLC

(57) ABSTRACT

A light emitting device includes a wiring substrate including an n-electrode and a p-electrode wired on a surface of the substrate, a light emitting element including an n-pad electrode joined directly to the n-electrode and a p-pad electrode joined directly to the p-electrode, a first gap between the n-electrode and the p-electrode, with the light emitting element being installed across that first gap, and an underfill, which fills a space between the wiring substrate and the light emitting element. At least one of the n-pad electrode and the p-pad electrode is divided into two islands with a linear shape second gap therebetween. The second gap is continuous with a linear shape third gap between the n-pad electrode and the p-pad electrode.

19 Claims, 7 Drawing Sheets

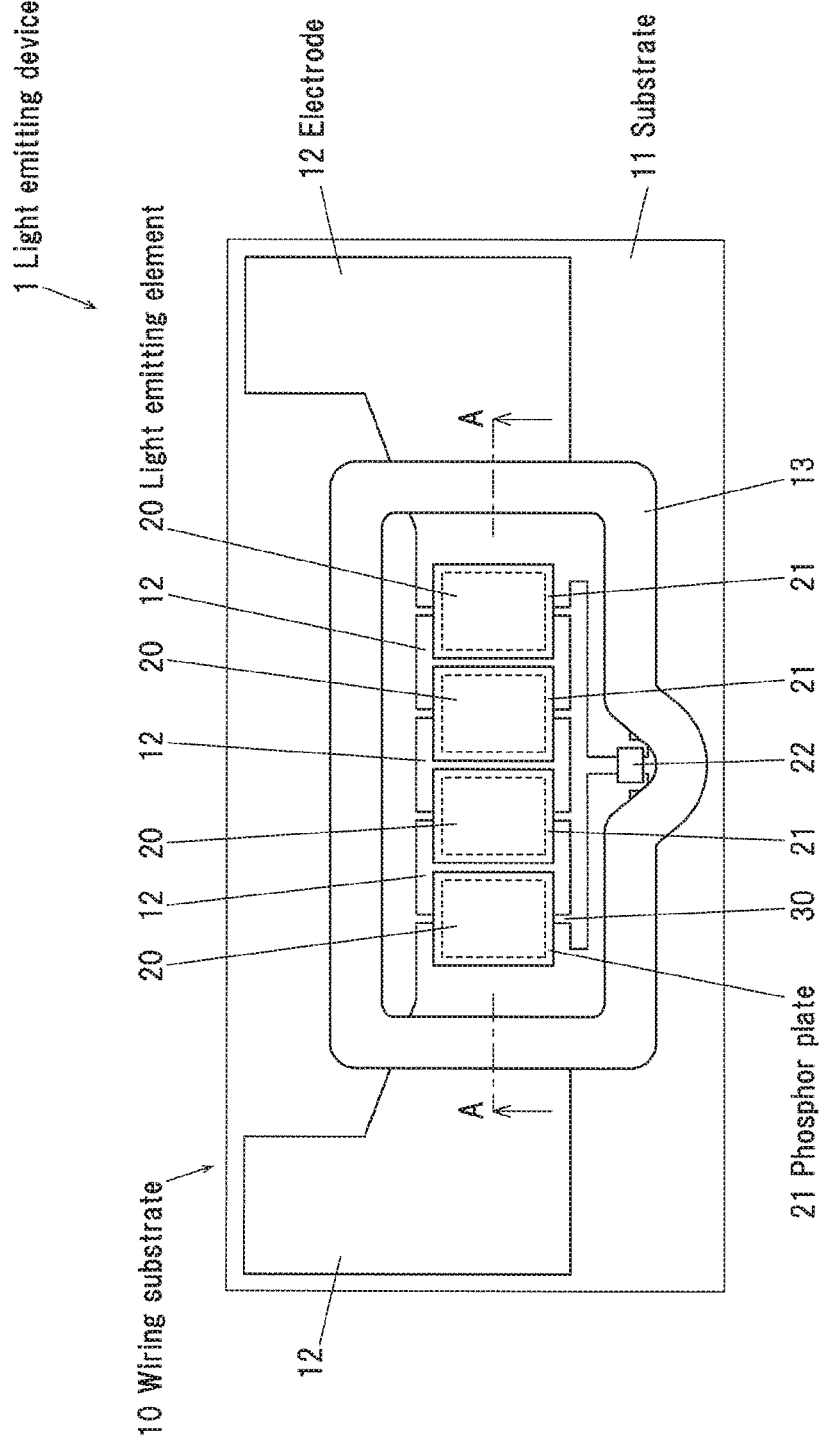

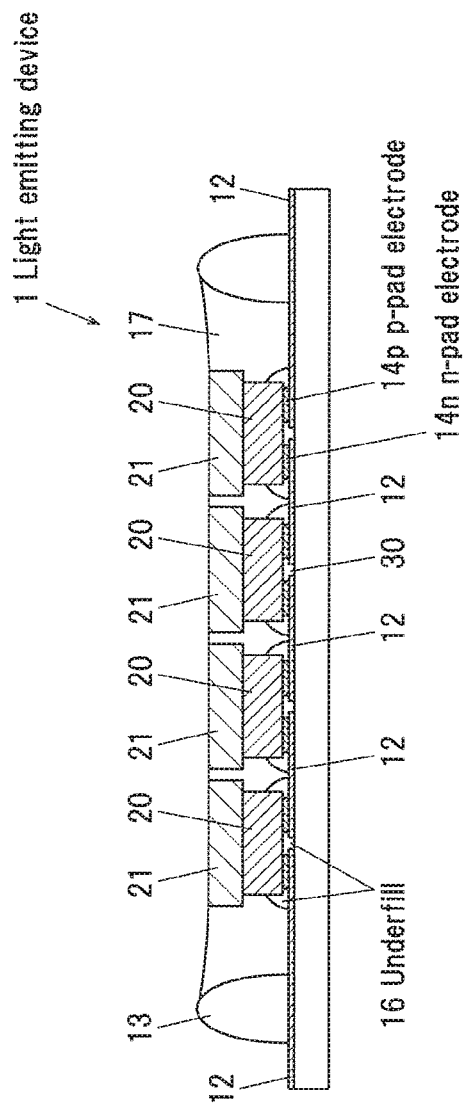

LIGHT EMITTING DEVICE

BACKGROUND OF THE INVENTION

1. Field of the Invention

The present invention relates to a light emitting device.

2. Description of the Related Art

Conventionally, there is known a light emitting device with a space between a face-down mounted light emitting element and a substrate being filled with a resin called underfill (see Patent Document 1, for example).

In the light emitting device described in Patent Document 1, by using a dummy bump as a junction point for flow of the underfill, it is possible to fill the gap between the light emitting element and the wiring substrate with the underfill with high accuracy.

[Patent Document 1] JP-A-2018-19032

SUMMARY OF THE INVENTION

In the manufacturing process for the light emitting device using the underfill, when the underfill is passed from a position at a distance from the light emitting element to fill the space between the light emitting element and the wiring substrate, the underfill flows not only in the space between the light emitting element and the wiring substrate, but also in the outer region of that space therebetween.

When the underfill having passed that outer region reaches the space between the light emitting element and the wiring substrate from the opposite side before completion of filling of that space with the underfill, void formation occurs in the underfill within the space. The occurrence of void formation in the underfill causes moisture to penetrate and permeate the underfill and accumulate in voids, leading to problems of damage (corrosion damage, etc.) to electrodes of the light emitting element, and the like.

According to the light emitting device described in Patent Document 1, although the flow of the underfill can be attracted by the dummy bump, such void formation can occur.

An object of the present invention is to provide a light emitting device having its structure to be able to suppress void formation in an underfill in a space between its wiring substrate and its light emitting element.

One aspect of the present invention provides light emitting devices defined by [1] to [7] below, to achieve the above object.

[1] A light emitting device, comprising: a wiring substrate including an n-electrode and a p-electrode wired on a surface of the substrate; a light emitting element including an n-pad electrode joined directly to the n-electrode and a p-pad electrode joined directly to the p-electrode; a first gap between the n-electrode and the p-electrode, with the light emitting element being installed across that first gap; and an underfill, which fills a space between the wiring substrate and the light emitting element, wherein at least one of the n-pad electrode and the p-pad electrode is divided into two islands with a linear shape second gap therebetween, wherein the second gap is continuous with a linear shape third gap between the n-pad electrode and the p-pad electrode.

[2] The light emitting device according to [1] above, further including flow blocking portions, which are provided at such a position on the n-electrode that the n-pad electrode is located between the n-electrode and the third gap, and at such a position on the p-electrode that the p-pad electrode is located between the p-electrode and the third gap, to block flow of the underfill before hardening of the underfill by contact with the underfill.

[3] The light emitting device according to the above [1] or [2], wherein a junction point of the second gap with the third gap is shifted from a middle point of the third gap in a length direction of the third gap.

[4] The light emitting device according to any one of the above [1] to [3], wherein in a part of a region of the third gap including one end portion in a length direction of the third gap, the third gap is wider in width towards that one end portion.

[5] The light emitting device according to any one of the above [1] to [4], wherein the n-electrode and the p-electrode are 1.0 µm or more in thickness.

[6] A light emitting device, comprising: a wiring substrate including an n-electrode and a p-electrode formed on a surface thereof; a light emitting element provided on the n-electrode and the p-electrode, the light emitting element including an n-pad electrode and a p-pad electrode that are connected to the n-electrode and the p-electrode of the wiring substrate; an underfill that fills a space between the wiring substrate and the light emitting element; and a gap for suppressing void formation in the underfill filled in the space.

[7] The light emitting device according to the above [6], wherein the gap comprises: a first gap that is formed between the n- and p-electrodes; a second gap that is formed on an edge on a side of the n-pad electrode and another edge on an opposite side of the n-pad electrode; and a third gap that is formed on an edge on a side of the p-pad electrode and another edge on an opposite side of the p-pad electrode.

Points of the Invention

According to the present invention, it is possible to provide the light emitting devices having their structure to be able to suppress void formation in the underfill in the space between their wiring substrate and their light emitting element.

BRIEF DESCRIPTION OF THE DRAWINGS

FIG. 1 is a top view of a light emitting device according to a first embodiment.

FIG. 2 is a vertical cross-sectional view of the light emitting device taken along section line A-A of FIG. 1.

DETAILED DESCRIPTION OF THE PREFERRED EMBODIMENTS

First Embodiment

Figure 3A:
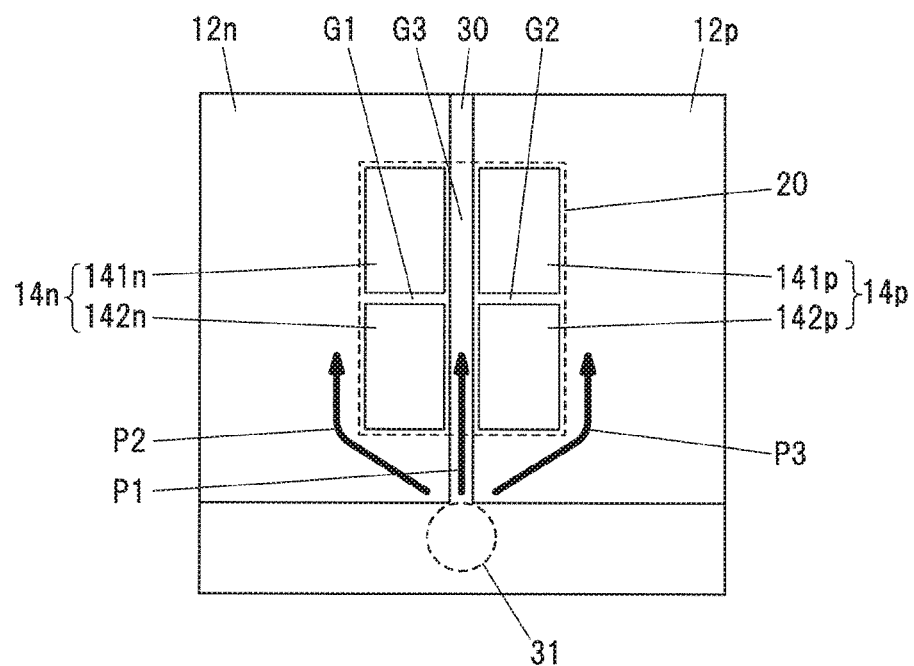
FIGS. 3A and 3B are enlarged top views around one light emitting element included in the light emitting device according to the first embodiment.

FIG. 1 is a top view of a light emitting device 1 according to the first embodiment. FIG. 2 is a vertical cross-sectional view of the light emitting device 1 taken along section line A-A of FIG. 1. Note that in FIG. 1, underfill 16 and sealing resin 17 are not shown.

The light emitting device 1 includes a wiring substrate 10 with electrodes 12 wired on a surface of a substrate 11, and light emitting elements 20 connected to the electrodes 12 of the wiring substrate 10.

The substrate 11 is configured as, for example, a ceramic substrate such as an $Al_2O_3$ substrate or an AlN substrate, a metal substrate such as an Al substrate or a Cu substrate whose surface is covered with an insulating film, or a glass epoxy substrate, and the electrodes 12 are made of an electrical conducting material such as copper.

The electrodes 12 act as an n-electrode or a p-electrode to supply a current to the light emitting elements 20. That is, one of the two electrodes 12 connected to each of the light emitting elements 20 acts as the n-electrode, and the other of the two electrodes 12 acts as the p-electrode.

Each of the light emitting elements 20 is installed across a groove 30 between adjacent electrodes 12 on the wiring substrate 10, that is, the gap 30 between the p-electrode and the n-electrode. For this reason, the gap 30 runs under each of the light emitting elements 20.

Note that the pattern of the electrodes 12 is not limited to those shown in FIGS. 1 and 2, and that the number and arrangement of the light emitting elements 20 are not limited to those shown in FIGS. 1 and 2.

The light emitting elements 20 are configured as, for example, LED chips having a chip substrate and a crystal layer including a light emitting layer and a cladding layer with the light emitting layer between it and the chip substrate. The light emitting elements 20 are being mounted with their crystal layers oriented toward the wiring substrate 10 side, that is, the light emitting elements 20 are being face-down mounted. The chip substrates are configured as transparent substrates made of sapphire or the like, and light is to be extracted from the chip substrate side. Further, the light emitting elements 20 may be configured as light emitting elements other than the LED chips, such as laser diodes or the like.

The light emitting elements 20 include an n-pad electrode 14n, which is joined directly to the n-electrodes (electrodes 12) without using an electrical conducting joining member such as an electrical conducting bump or an electrical conducting paste, and a p-pad electrode 14p, which is joined directly to the p-electrodes (electrodes 12) without using an electrical conducting joining member.

The n-pad electrodes 14n and the p-pad electrodes 14p are configured as the pad electrodes made of, for example, AuSn, and are joined to the electrodes 12 by heat treatment while being in contact with the electrodes 12 whose outermost surfaces are made of Au to diffuse Sn.

Figure 3B:
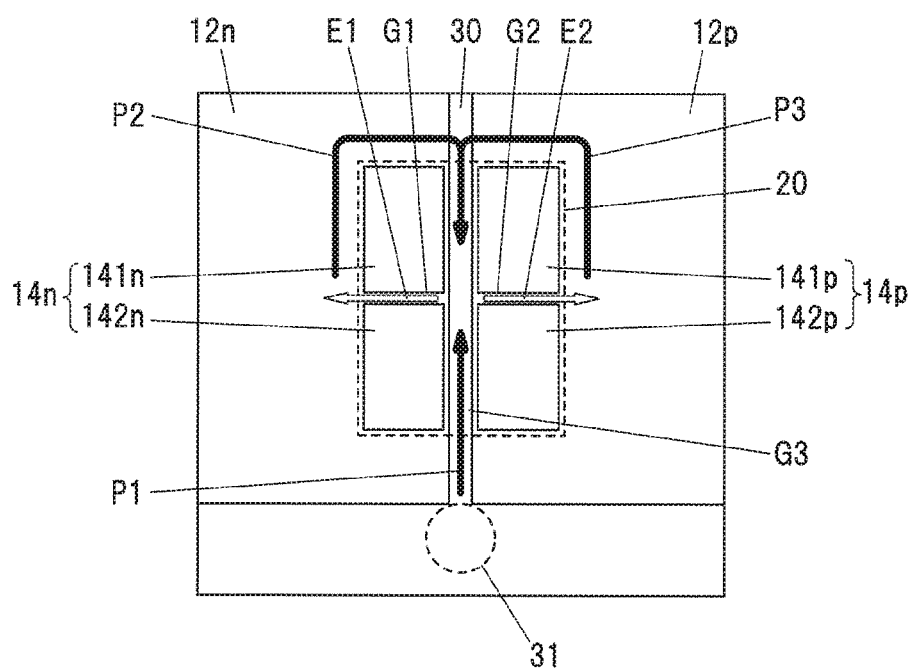

FIGS. 3A and 3B are enlarged top views around one light emitting element 20 included in the light emitting device 1, and show a configuration of the n-pad electrode 14n and the p-pad electrode 14p. Further, FIGS. 3A and 3B schematically show flow paths of an underfill 16. The flow paths of the underfill 16 will be described later.

In FIG. 3A and FIG. 3B, two of the electrodes 12 to which the one light emitting element 20 is connected are referred to as n-electrode 12n and p-electrode 12p, respectively. Further, the outline of the one light emitting element 20 is indicated by a dotted line, and only the n-pad electrode 14n and the p-pad electrode 14p are indicated by a solid line. Further, the adjacent other light emitting elements 20, the electrodes 12 other than the n-electrode 12n and the p-electrode 12p, and a phosphor plate 21 are not shown.

As shown in FIGS. 3A and 3B, the n-pad electrode 14n is being divided into an island 141n and an island 142n with a linear shape gap G1 therebetween, while the p-pad electrode 14p is being divided into an island 141p and an island 142p with a linear shape gap G2 therebetween. The gap G1 and the gap G2 are continuous with a linear shape gap G3 between the n-pad electrode 14n and the p-pad electrode 14p.

Typical locations of the gap G1 and the gap G2 are shown in FIGS. 3A and 3B. In this example, a junction point of the gap G1 with the gap G3 and a junction point of the gap G2 with the gap G3 are located at a middle point of the gap G3 in a length direction of the gap G3. Further, the length directions of the gap G1 and the gap G2 are at right angles to the length direction of the gap G3.

The underfill 16 is configured to fill a space between the wiring substrate 10 and the light emitting element 20, to cover the n-pad electrode 14n and the p-pad electrode 14p of the light emitting element 20, to be able to prevent exposure of the n-pad electrode 14n and the p-pad electrode 14p to moisture or air and damage (corrosion damage etc.) resulting therefrom. Further, the underfill 16 can also enhance the joining strength between the wiring substrate 10 and the light emitting element 20. The fluid underfill 16 hardens after filling the space between the wiring substrate 10 and the light emitting element 20.

The underfill 16 is made of, for example, a resin such as a silicone based resin or an epoxy based resin. In addition, the underfill 16 acts as a reflecting material by including a white filler or the like therein, to be able to enhance the emission intensity of the light emitting device 1.

The fluid underfill 16 is dripped on the wiring substrate 10 with a dispenser or the like, and when the fluid underfill 16 comes into contact with an end portion of the gap 30 on the wiring substrate 10, the fluid underfill 16 flows toward the light emitting element 20 due to capillary action in the gap 30. The flow of the underfill 16 dripped to a dripping position 31 shown in FIGS. 3A and 3B will be described below as one example.

The dripped underfill 16 flows through the dripping position 31 and mainly along three paths indicated by arrows in FIG. 3A. The path P1 denotes the path through a space constituted by the gap 30 and the gap G3. The path P2 denotes the path through a region on the n-electrode 12n with the n-pad electrode 14n being located between it and the gap G3. The path P3 denotes the path through a region on the p-electrode 12p with the p-pad electrode 14p being located between it and the gap G3. That is, the path P2 and the path P3 denote the paths through the outer sides of the space between the wiring substrate 10 and the light emitting element 20.

Here, typically, when the flow speed of the underfill 16 passing through the path P1 is sufficiently greater than the flow speeds of the underfills 16 passing through the path P2 or the path P3, the underfill 16 properly fills the space between the wiring substrate 10 and the light emitting element 20.

As shown in FIG. 3B, however, before the underfill 16 passing through the path P1 fills the space between the wiring substrate 10 and the light emitting element 20, when the underfills 16 having passed the path P2 or the path P3 reach the space between the wiring substrate 10 and the light emitting element 20 from the opposite side to the dripping position 31, part or all of the exit of the space between the wiring substrate 10 and the light emitting element 20 for the underfill 16 passing through the path P1 to exit is blocked by the underfills 16 having passed the path P2 or the path P3.

Even in this case, in the light emitting device 1, the gap G1 and the gap G2 serve as air escape routes to push out the air sandwiched between the underfills 16 within the space between the wiring substrate 10 and the light emitting element 20 to the outside via the gap G1 and the gap G2, as indicated by arrows E1 and E2 of in FIG. 3B. For this reason, in the space between the wiring substrate 10 and the light emitting element 20, the air is prevented from remaining in the underfill 16 as voids.

The underfill 16 fills the space constituted by the gap 30 and the gap G3, and then flows from the gap G3 side into the gap G1 and the gap G2, and fills the gap G1 and the gap G2. This makes it possible to fill the space between the wiring substrate 10 and the light emitting element 20 with the underfill 16, while suppressing void formation in the underfill 16.

In order to deepen the gap 30 and increase the flow speed of the underfill 16 passing through the path P1, the thicknesses of the electrodes 12 are preferably 1.0 μm or more.

Figure 4A:
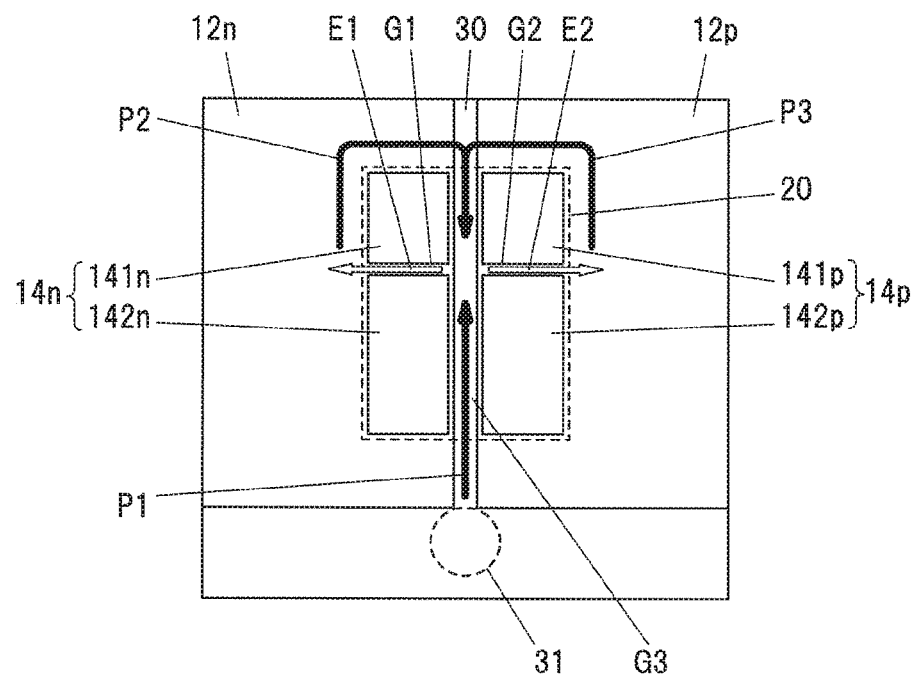
FIGS. 4A and 4B are top views showing modifications to an n-pad electrode and a p-pad electrode according to the first embodiment.
Figure 4B:
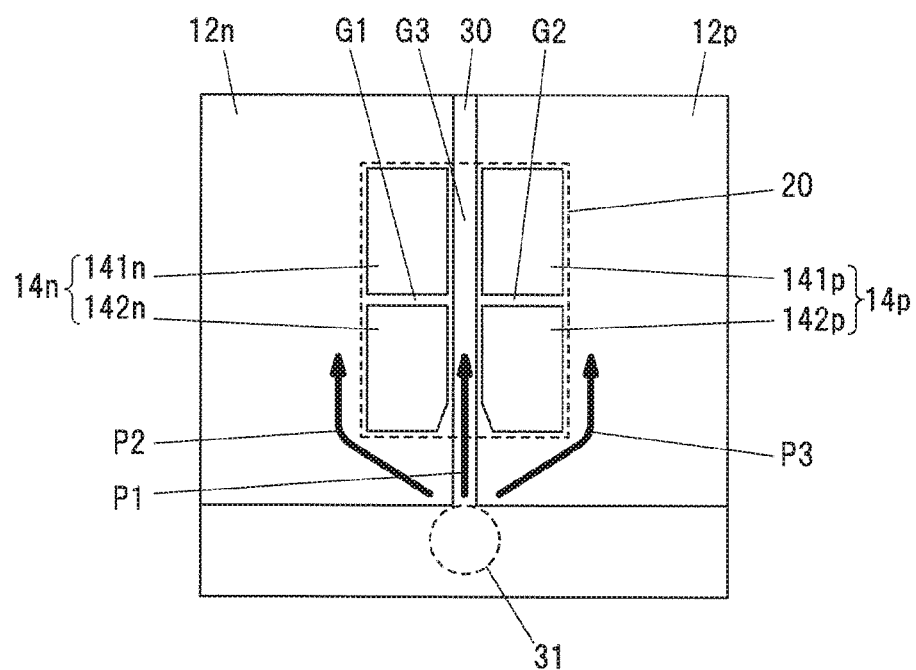

FIG. 4A and FIG. 4B are top views corresponding to FIGS. 3A and 3B and showing modifications to the n-pad electrode 14n and the p-pad electrode 14p.

In the example shown in FIG. 4A, the junction point of the gap G1 with the gap G3 and the junction point of the gap G2 with the gap G3 are located at a longer distance from the underfill 16 dripping position 31 on the wiring substrate 10 than the distance from the dripping position 31 to the middle point of the gap G3 in the length direction of the gap G3.

This is because in the space constituted by the gap 30 and the gap G3, the distances from the dripping position 31 to the points where the underfill 16 entering through the path P1 and the underfills 16 entering through the path P2 or the path P3 meet are often longer than the distance from the dripping position 31 to the middle point of the gap G3 in the length direction of the gap G3, in which case it is possible to effectively allow the air to escape from the gap G2 and the gap G3.

That is, when the junction point of the gap G1 with the gap G3 and the junction point of the gap G2 with the gap G3 are shifted from the middle point of the gap G3 in the length direction of the gap G3, by dripping the underfill 16 to the position in the opposite direction to that shift direction, it is possible to more effectively suppress void formation in the underfill 16 to fill the space between the wiring substrate 10 and the light emitting element 20.

In the example shown in FIG. 4B, the width of the gap G3 is wider toward an outer side in a part of an underfill 16 dripping position 31 side region of the gap G3. This facilitates the forward movement of the underfill 16 to the path P1, while relatively reducing the amount of the underfill 16 which moves to the path P2 and the path P3, therefore making it possible to more effectively suppress void formation in the underfill 16 to fill the space between the wiring substrate 10 and the light emitting element 20.

That is, in the part of the region of the gap G3 including the one end portion in the length direction of the gap G3, when the width of the gap G3 is wider toward that one end portion, by dripping the underfill 16 to the one end portion side, it is possible to more effectively suppress void formation in the underfill 16 to fill the space between the wiring substrate 10 and the light emitting element 20.

Note that according to the embodiment shown in FIG. 4B, the points where the underfill 16 entering through the path P1 and the underfills 16 entering through the path P2 or the path P3 meet are likely to be located at a longer distance from the dripping position 31 than the distance from the dripping position 31 to the middle point of the gap G3 in the length direction of the gap G3. For this reason, by combining that configuration shown in FIG. 4B with the configuration shown in FIG. 4A (the configuration where the junction point of the gap G1 with the gap G3 and the junction point of the gap G2 with the gap G3 are located at a longer distance from the underfill 16 dripping position 31 on the wiring substrate 10 than the distance from the dripping position 31 to the middle point of the gap G3 in the length direction of the gap G3), it is possible to more effectively suppress void formation in the underfill 16 to fill the space between the wiring substrate 10 and the light emitting element 20.

Figure 5A:
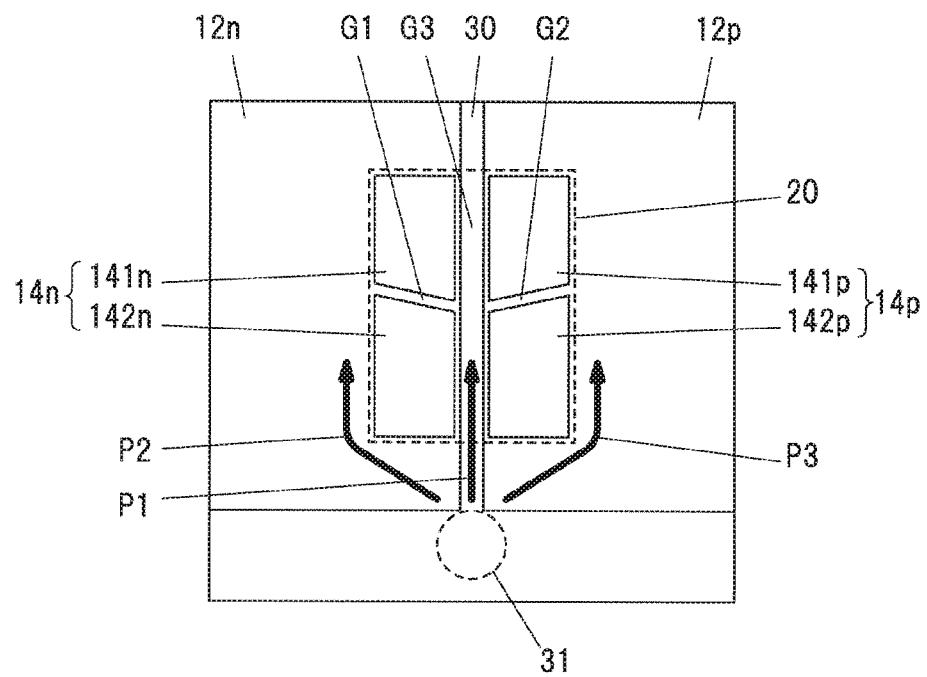
FIGS. 5A and 5B are top views showing other modifications to the n-pad electrode and the p-pad electrode according to the first embodiment.
Figure 5B:
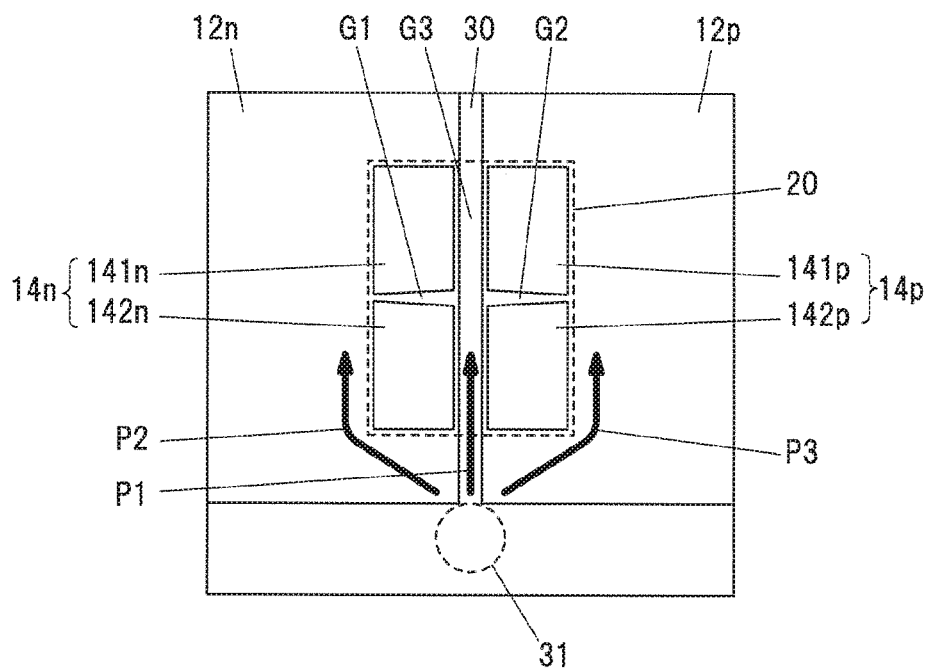

FIGS. 5A and 5B are top views corresponding to FIG. 3 and showing other modifications to the n-pad electrode 14n and the p-pad electrode 14p.

In the example shown in FIG. 5A, the gap G1 and the gap G2 are inclined with respect to the gap G3 in such a manner that the extending directions of the gap G1 and the gap G2 which are being extended toward the path P2 and the path P3 in the length directions of the gap G1 and the gap G2 intersect the forward movement directions of the path P2 and the path P3 at acute angles. For this reason, when the underfills 16 flowing through the path P2 and the path P3 are about to enter the gap G1 and the gap G2 from outer sides, the underfills 16 are required to bend their forward movement directions at the acute angles.

That is, when the gap G1 and the gap G2 are inclined with respect to the gap G3, by dripping the underfill 16 to such a position that the underfills 16 flowing through the outer sides of the light emitting element 20 cannot enter the gap G1 and the gap G2 without bending their forward movement directions at the acute angles, it is possible to effectively slow the ingress of the underfills 16 flowing through the outer sides of the light emitting element 20 into the gap G1 and the gap G2 from the outer sides.

In the example shown in FIG. 5B, in the widths of the gap G1 and the gap G2, the widths of the opposite (outer) end portions of the gap G1 and the gap G2 relative to the G3 sides are smaller than the widths of the G3 side end portions of the gap G1 and the gap G2. This makes it possible to effectively slow the ingress of the underfills 16 passing through the path P2 and the path P3 into the gap G1 and the gap G2 from the outer sides.

According to the embodiment shown in FIG. 5B, it is possible to effectively slow the ingress of the underfills 16 flowing through the outer sides of the light emitting element 20 into the gap G1 and the gap G2 from the outer sides regardless of the underfill 16 dripping position. Note that in the example shown in FIG. 5B, the widths of the gap G1 and the gap G2 are continuously changed in the length direction of the gap G1 and the gap G2, but may be changed stepwise.

A phosphor plate 21 is installed on the light emitting element 20. The phosphor plate 21 is formed of a flat plate-like phosphor-containing member or a flat plate-like transparent member such as a flat plate-like resin member with a phosphor, for example, phosphor particles dispersed therein or a flat plate-like phosphor sintered body. The fluorescent color of the phosphor contained in the phosphor plate 21 or constituting the phosphor plate 21 is not particularly limited.

The light emitting element 20 acts as an excitation light source for the phosphor contained in the phosphor plate 21 or constituting the phosphor plate 21, and an emission color of the light emitting element 20 and an emission color of the phosphor plate 21 are mixed together to produce an emission color of the light emitting device 1. For example, when the emission color of the light emitting element 20 is blue and the emission color of the phosphor plate 21 is yellow, the emission color of the light emitting device 1 is white.

The light emitting device 1 may have a Zener diode 22, which is electrically connected to the light emitting elements 20 to absorb a surge voltage, as shown in FIG. 1. In this case, it is preferable that the installation position for the Zener diode 22 be out of the extended line of the gap 30 in order to prevent the Zener diode 22 from obstructing the dripping of the underfill 16, or the dripped underfill 16 from being attracted to the Zener diode 22 side.

Further, as shown in FIGS. 1 and 2, the light emitting device 1 may have an annular dam 13, which is formed in such a manner as to surround the installation region for the light emitting elements 20. The dam 13 is made of, for example, a resin such as a silicone based resin or an epoxy based resin, and may contain a white dye such as titanium oxide.

The region in the inner side of the dam 13 is filled with a sealing resin 17 for sealing the light emitting elements 20. The sealing resin 17 is made of, for example, a transparent resin such as a silicone based resin or an epoxy based resin. In addition, the sealing resin 17 may contain a phosphor.

Second Embodiment

A light emitting device according to a second embodiment of the present invention has, on electrodes 12, flow blocking portions to suppress the flows of the unhardened underfills 16 flowing through the outer sides of the light emitting elements 20. Note that the same members as those of the first embodiment are given the same reference characters, and descriptions thereof are omitted or simplified.

Figure 6:
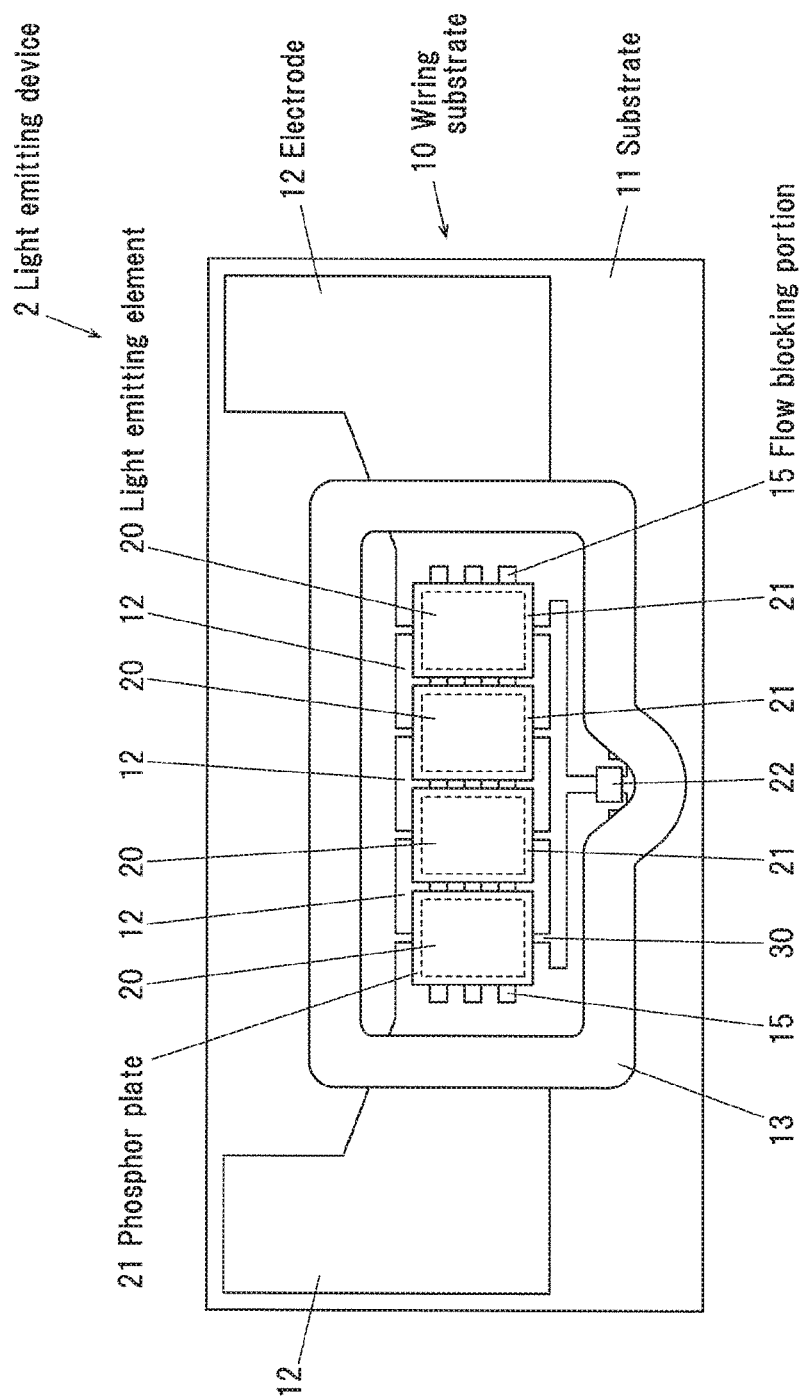
FIG. 6 is a top view of a light emitting device according to a second embodiment.
Figure 7:
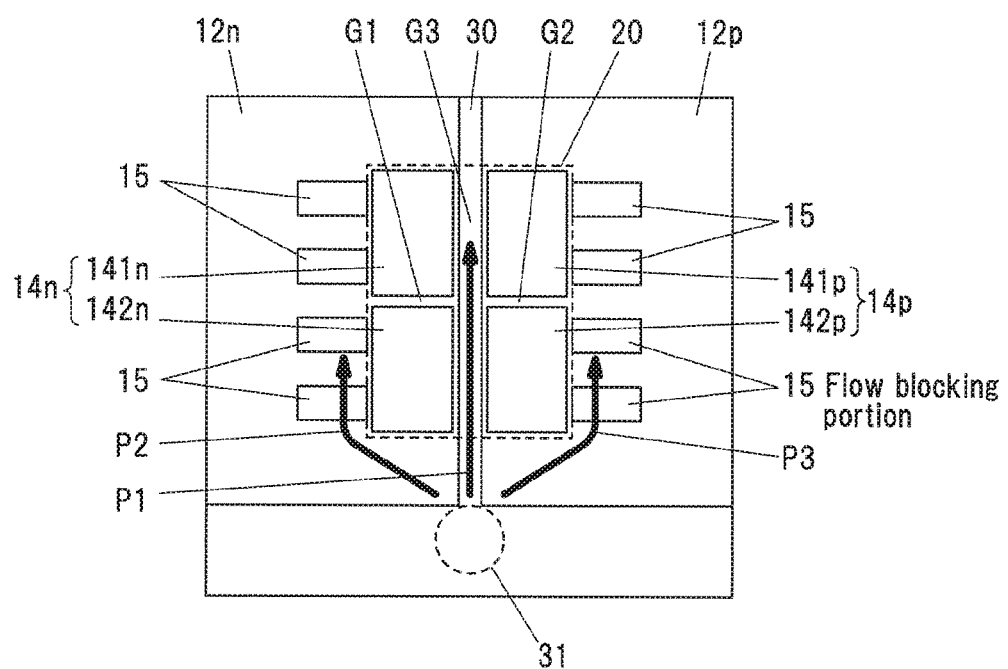
FIG. 7 is an enlarged top view around one light emitting element included in the light emitting device according to the second embodiment.

FIG. 6 is a top view of the light emitting device 2 according to the second embodiment. FIG. 7 is an enlarged top view around one light emitting element 20 included in the light emitting device 2 before completion of filling with the underfill 16.

In FIG. 7, in the same manner as in FIG. 3, the outline of the one light emitting element 20 is indicated by a dotted line, and only the n-pad electrode 14n and the p-pad electrode 14p are indicated by a solid line. Further, the adjacent other light emitting elements 20, the electrodes 12 other than the n-electrode 12n and the p-electrode 12p, and the phosphor plate 21 are not shown.

In the light emitting device 2, the flow blocking portions 15 are being provided at positions in the outer sides of the space between the wiring substrate 10 and the light emitting elements 20, in other words, at such a position on the n-electrode 12n that the n-pad electrode 14n is located between the n-electrode 12n and the gap G3, and at such a position on the p-electrode 12p that the p-pad electrode 14p is located between the p-electrode 12p and the gap G3.

The flow blocking portions 15 are configured as holes or protrusions provided on the electrodes 12 (the n-electrode 12n and the p-electrode 12p). The flow blocking portions 15 when configured as holes may be configured as through holes, which pass through the electrodes 12 or may be configured as recesses of the electrodes 12, which do not pass through the electrodes 12. In addition, the flow blocking portions 15 when configured as protrusions may be configured as part of the electrodes 12 or may separately be installed on the surfaces of the electrodes 12.

Since the flow blocking portions 15 are being provided on the path P2 and the path P3 of the underfill 16, the flow blocking portions 15 are able to block the flows of the underfills 16 flowing through the path P2 and the path P3. This makes it possible to relatively increase the flow speed of the underfill 16 flowing in the path P1, and thereby suppress void formation in the underfill 16 resulting from the ingress of the underfill 16 into the space constituted by the gap 30 and the gap G3 from both the sides.

Furthermore, as with the light emitting device 1 according to the first embodiment, the light emitting device 2 has the gap G1 and the gap G2, to make it possible to effectively allow the air in the space between the wiring substrate 10 and the light emitting element 20 to escape to the outside, and therefore more effectively suppress void formation in the underfill 16 to fill the space between the wiring substrate 10 and the light emitting element 20.

Since the flow blocking portions 15 block the flows of the underfills 16 flowing through the path P2 and the path P3, the underfill 16 hardens while remaining in contact with the flow blocking portions 15.

Advantageous Effects of the Embodiments

According to the light emitting device 1 according to the above first embodiment, by providing the gap G1 and the gap G2, it is possible to suppress void formation in the underfill 16 in the space between the wiring substrate 10 and the light emitting elements 20.

Furthermore, according to the light emitting device 1 according to the above second embodiment, by providing the flow blocking portions 15, it is possible to more effectively suppress void formation in the underfill 16 in the space between the wiring substrate 10 and the light emitting elements 20.

Note that since the light emitting device 1 and the light emitting device 2 have their structures to be able to suppress void formation in the underfill 16 in the space between the wiring substrate 10 and the light emitting elements 20, even when the underfill 16 and the sealing resin 17 are continuously integrally formed of the same material, void formation therein is likely to be able to be sufficiently suppressed. In this case, for example, the resin is poured evenly into the region between the dam 13 and the light emitting elements 20 to form the underfill 16 and the sealing resin 17.

Furthermore, the light emitting device 1 and the light emitting device 2 may have only one of the gap G1 and the gap G2 as long as the void formation in the underfill 16 in the space between the wiring substrate 10 and the light emitting elements 20 can be suppressed. That is, only one of the n-pad electrode 14n and the p-pad electrode 14p may be divided.

Although the embodiments of the present invention have been described above, this invention is not limited to the above-described embodiments, but various modifications can be implemented without deviating from the spirit of the invention. Further, any combinations of the constituent elements of the above-described embodiments can be made without departing from the spirit of the invention.

Further, the embodiments described above do not limit the inventions according to the claims. It should also be noted that not all combinations of the features described in the embodiments are indispensable to the means for solving the problem of the invention.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

DESCRIPTIONS OF THE REFERENCE CHARACTERS 1, 2 Light emitting device
10 Wiring substrate
11 Substrate
12, 12n, 12p-electrode
13 Dam
14n n-pad electrode
141n, 142n Island
14p p-pad electrode
141p, 142p Island
15 Flow blocking portion
16 Underfill
17 Sealing resin
20 Light emitting element
30 Gap
G1, G2, G3 Gap

What is claimed is:

1. A light emitting device, comprising:
a wiring substrate including an n-electrode and a p-electrode wired directly on a same surface of the wiring substrate;
a light emitting element including an n-pad electrode joined directly to the n-electrode and a p-pad electrode joined directly to the p-electrode;
a first gap between the n-electrode and the p-electrode, with the light emitting element being installed across that first gap; and
an underfill, which fills a space between the wiring substrate and the light emitting element,
wherein the n-pad electrode and the p-pad electrode are divided into two islands with a linear shaped second gap therebetween directly under a single one of the light-emitting element, and
wherein the second gap is continuous with a linear shaped third gap between the n-pad electrode and the p-pad electrode.

2. The light emitting device according to claim 1, further including flow blocking portions, which are provided at such a position on the n-electrode that the n-pad electrode is located between the n-electrode and the third gap, and at such a position on the p-electrode that the p-pad electrode is located between the p-electrode and the third gap, to block flow of the underfill before hardening of the underfill by contact with the underfill.

3. The light emitting device according to claim 1, wherein a junction point of the second gap with the third gap is shifted from a middle point of the third gap in a length direction of the third gap.

4. The light emitting device according to claim 2, wherein a junction point of the second gap with the third gap is shifted from a middle point of the third gap in a length direction of the third gap.

5. The light emitting device according to claim 1, wherein in a part of a region of the third gap including one end portion in a length direction of the third gap, the third gap is wider in width towards the one end portion.

6. The light emitting device according to claim 2, wherein in a part of a region of the third gap including one end portion in a length direction of the third gap, the third gap is wider in width towards the one end portion.

7. The light emitting device according to claim 3, wherein in a part of a region of the third gap including one end portion in a length direction of the third gap, the third gap is wider in width towards the one end portion.

8. The light emitting device according to claim 1, wherein the n-electrode and the p-electrode are 1.0 μm or more in thickness.

9. The light emitting device according to claim 2, wherein the n-electrode and the p-electrode are 1.0 μm or more in thickness.

10. The light emitting device according to claim 3, wherein the n-electrode and the p-electrode are 1.0 μm or more in thickness.

11. The light emitting device according to claim 4, wherein the n-electrode and the p-electrode are 1.0 μm or more in thickness.

12. The light emitting device according to claim 11, wherein, in a plan view, the third gap overlaps with the first gap.

13. The light emitting device according to claim 11, wherein at least one of the n-electrode and the p-electrode is disposed on an uppermost surface of the wiring substrate.

14. The light emitting device according to claim 11, wherein a portion of an upper surface of the n-electrode is exposed to outside of the n-pad electrode and the underfill.

15. A light emitting device, comprising:
a wiring substrate including an n-electrode and a p-electrode termed directly on a same surface thereof;
a light emitting element provided on the n-electrode and the p-electrode, the light emitting element including an n-pad electrode and a p-pad electrode that are connected to the n-electrode and the p-electrode of the wiring substrate;
an underfill that fills a space between the wiring substrate and the light emitting element and a gap for suppressing void formation in the underfill filled in the space, wherein the gap comprises:
a first gap that is formed between the n-electrode and the-electrode:
a second gap that is formed on an edge on a side of the n-cad electrode and another edge on an opposite side of the n-pad electrode directly under a single one of the light emitting element; and
a third gap that is formed on an edge on a side of the p-pad electrode and another edge on an opposite side of the p-pad electrode directly under the single one of the light emitting element.

16. The light emitting device according to claim 15, wherein at least one of the n-electrode and the p-electrode is disposed on an uppermost surface of the wiring substrate.

17. The light emitting device according to claim 15, wherein a portion of an upper surface of the n-electrode is exposed to outside of the n-pad electrode and the underfill.

18. The light emitting device according to claim 15, wherein the first gap is continuous with the second gap and the third gap.

19. The light emitting device according to claim 12, wherein, in a plan view, the first gap intersects with the second gap and the third gap.

* * * * *